(12) United States Patent
Hsu et al.

(10) Patent No.: US 6,197,637 B1
(45) Date of Patent: Mar. 6, 2001

(54) METHOD FOR FABRICATING A NON-VOLATILE MEMORY CELL

(75) Inventors: Sung-Mu Hsu; Yi-Peng Jan, both of Hsinchu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/580,871

(22) Filed: May 30, 2000

(30) Foreign Application Priority Data

Sep. 8, 1999 (TW) ................................. 088115466

(51) Int. Cl.[7] ................................................. H01L 21/336
(52) U.S. Cl. ........................ 438/257; 438/593; 438/594; 438/596; 438/976
(58) Field of Search ................................. 438/197, 257, 438/593, 596, 696, 700, 976, 594

(56) References Cited

U.S. PATENT DOCUMENTS

| | | | |
|---|---|---|---|
| 5,432,112 | * | 7/1995 | Hong ........................................ 437/43 |
| 5,646,059 | * | 7/1997 | Sheu et al. ............................. 437/43 |
| 5,950,090 | * | 9/1999 | Chen et al. ............................ 438/296 |

* cited by examiner

*Primary Examiner*—Matthew Smith
*Assistant Examiner*—Craig P Lytle
(74) *Attorney, Agent, or Firm*—Birch, Stewart, Kolasch & Birch, LLP

(57) ABSTRACT

A method for fabricating a non-volatile memory cell for a substrate includes the following steps: forming an isolation structure to define an active region on the substrate; forming a channel oxide layer on the active region; forming a conducting layer and a silicon nitride layer over the substrate; defining the polysilicon layer and the silicon nitride layer to form a floating gate on the active region and to form an opening exposing a portion of the isolation structure; conformally forming an etching protection layer which extends from the isolation structure inside the opening up to the silicon nitride layer; forming an oxide layer over the substrate; planarizing the oxide layer to the surface of the silicon nitride layer so that the remainder of the oxide layer is left within the opening; removing the silicon nitride layer; forming conducting spacers on the sidewalls of the remainder of the oxide layer; removing the remainder of the TEOS oxide layer; conformally forming an ONO layer; forming a controlling ate on the ONO layer; and forming source/drain regions.

14 Claims, 10 Drawing Sheets

METHOD FOR FABRICATING A NON-VOLATILE MEMORY CELL

BACKGROUND OF THE INVENTION

1. Field of the Invention

The present invention relates to a method for fabricating a non-volatile memory cell, and more particularly to a method for improving the gate coupling ratio of a non-volatile memory cell in fabrication.

2. Background of the Invention

According to the related prior art, a conventional method for fabricating a non-volatile memory cell is illustrated in FIG. 1A to FIG. 1D and FIG. 2A to FIG. 2E. FIG. 1A to FIG. 1D are the layout figures of a non-volatile memory cell. FIG. 2A to FIG. 2E respectively shows the corresponding cross-sectional figures of the manufacturing steps of the same non-volatile memory cell. For example, the active region 100 shown in FIG. 1A is defined on the substrate 10 shown in FIG. 2A. FIG. 2A illustrates the cross-sectional view of the memory cell along the line 2a—2a in FIG. 1A.

As shown in FIG. 1A and FIG. 2A, the initial step is to form a field oxide layer 30 on the surface of the substrate 10 to define the active region 100. Subsequently, a channel oxide layer 20 is formed on the surface of the active region 100.

FIG. 2B shows the cross-sectional view of the memory cell along the line 2b—2b in FIG. 1A. This procedure utilizes a chemical vapor deposition process to form a polysilicon layer. Then, photolithography and etching processes are utilized to define the polysilicon layer to form a floating gate 40. Then, an insulating material such as a typical oxide-nitride-oxide ONO structure 50 is conformally deposited over the surface of the substrate 10.

FIG. 2C shows the cross-sectional view of the memory cell along the line 2c—2c in FIG. 1C. In this procedure a chemical vapor deposition process is utilized to form a polysilicon layer; a photoresist layer is coated thereon; and then a controlling gate electrode mask (not shown) is formed. Through exposure and photolithography processes, a patterned photoresist 61 is formed. With this photoresist 61, an etching process is utilized to define the polysilicon layer to form a controlling gate 60.

FIG. 2D shows the cross-sectional view of the memory cell along the line 2d—2d in FIG. 1D. In this procedure, the patterned photoresist 61 is utilized as a mask, and etching steps are sequentially utilized to remove the uncovered portions of the insulating layer 50 and the floating gate 40. Then, the patterned photoresist 61 is removed and the source/drain regions are formed. Thus, the fabrication of a non-volatile memory cell is completed.

As illustrated in FIG. 1D, the slanted-line shadow area depicts the floating gate 40 and the spotted shadow area depicts the controlling gate 60.

Furthermore, FIG. 2E shows the cross-sectional view of the memory cell along the line 2e—2e in FIG. 1D. Therein, the structure along the other direction of the non-volatile memory cell, including the source region 70 and the drain region 80, can be seen.

FIG. 3 illustrates the equivalent circuit diagram of the foregoing non-volatile memory cell. Therein, the equivalent capacitance effect is generated in the memory cell structure which includes a channel oxide layer 20, a floating gate 40, an insulating layer 50, a controlling gate electrode 60, a source electrode S-70, a drain electrode D-80 and a semiconductor substrate B-10.

When the non-volatile memory cell is activated by an appropriate voltage, a capacitance C1 will be formed across the insulating layer 50 between the floating gate 40 and the controlling gate 60 and a capacitance C2 will also be formed across the channel oxide layer 20 between the floating gate 40 and the substrate 10. When the floating gate voltage is V1 and the controlling gate voltage is V2, the relation equation of the capacitance values and the voltage values is as follows:

$$V1=C1/(C1+C2)*V2.$$

Based on the foregoing relation equation, a larger capacitance C1 has a relatively higher gate voltage coupling ratio. In other words, a larger capacitance C1 decreases the operation voltage required for a non-volatile memory cell to perform the program/erase operation.

The prior art for improving the gate coupling ratio of a non-volatile memory cell is as described in the U.S. Pat. No. 5,646,059. Referring to FIG. 4, the prior art mainly utilizes the polysilicon spacers 148 formed by the liquid phase deposition process to increase the surface area of the insulating region 150 between the floating gate 140 and the controlling gate 160. Thus, the gate coupling ratio is improved.

However, the main disadvantage of the foregoing prior art is that the process is complicated and difficult to control. Thus, it is not suitable for mass production.

SUMMARY OF THE INVENTION

Accordingly, an object of the present invention is to provide a method for fabricating a non-volatile memory cell to solve the above-mentioned problems confronted in the prior art. This present invention applies to a substrate and includes the following steps: forming an isolation structure to define an active region on the substrate; forming a channel oxide layer on the active region; forming a conducting layer and a silicon nitride layer over the substrate; defining the polysilicon layer and the silicon nitride layer to form a floating gate on the active region and an opening exposing a portion of the isolation structure; conformally forming an etching protection layer which extends from the isolation structure inside the opening up to the silicon nitride layer; forming an oxide layer over the substrate; planarizing the oxide layer to the surface of the silicon nitride layer so that the remainder of the oxide layer is left within the opening; removing the silicon nitride layer; forming conducting spacers on the sidewalls of the remainder of the oxide layer; removing the remainder of the oxide layer; conformally forming an ONO layer; forming a controlling gate on the ONO layer; and forming source/drain regions.

BRIEF DESCRIPTION OF THE DRAWINGS

In the following paragraphs, a preferred embodiment of the method for fabricating a non-volatile memory cell according to this present invention is illustrated with reference to the accompanying drawings, in which.

PREFERRED EMBODIMENT OF THE INVENTION

Figure 1A:
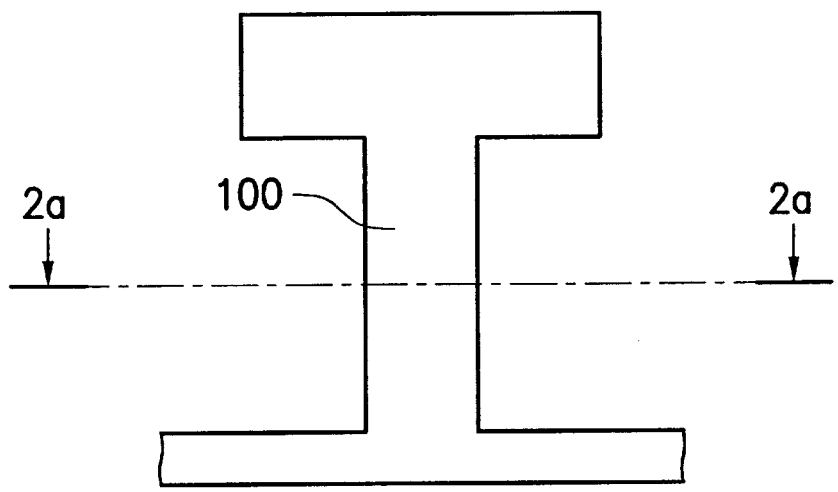
FIG. 1A to FIG. 1D are the layout figures of a conventional non-volatile memory cell.
Figure 1B:
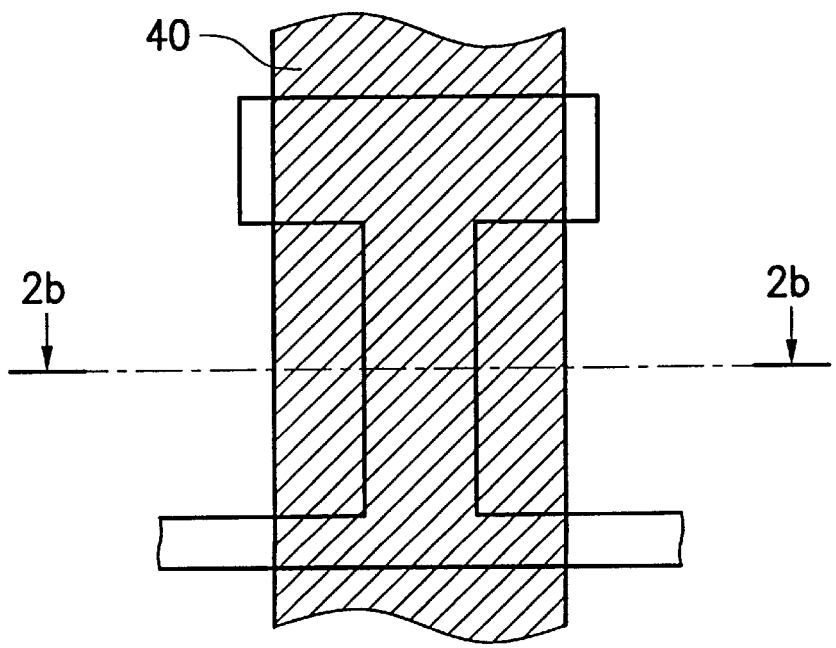
Figure 1C:
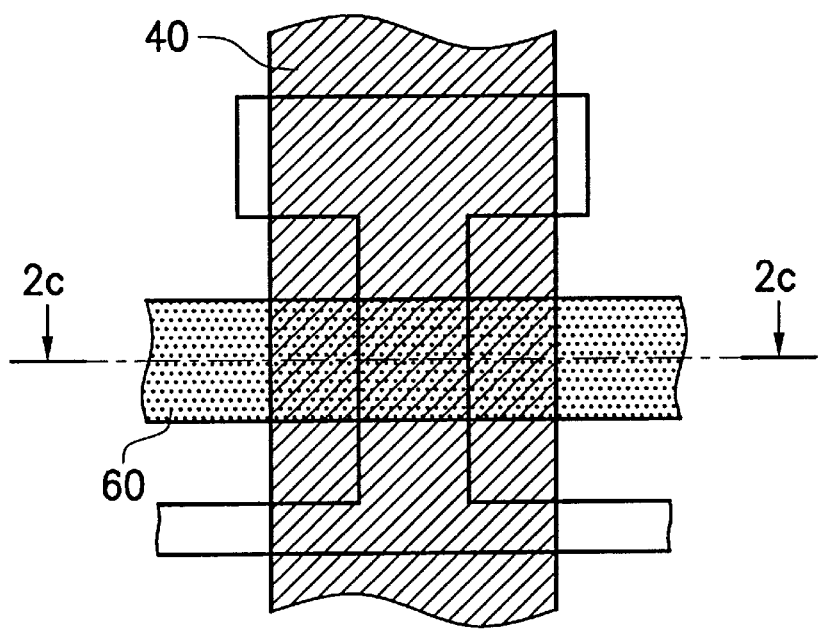
Figure 1D:
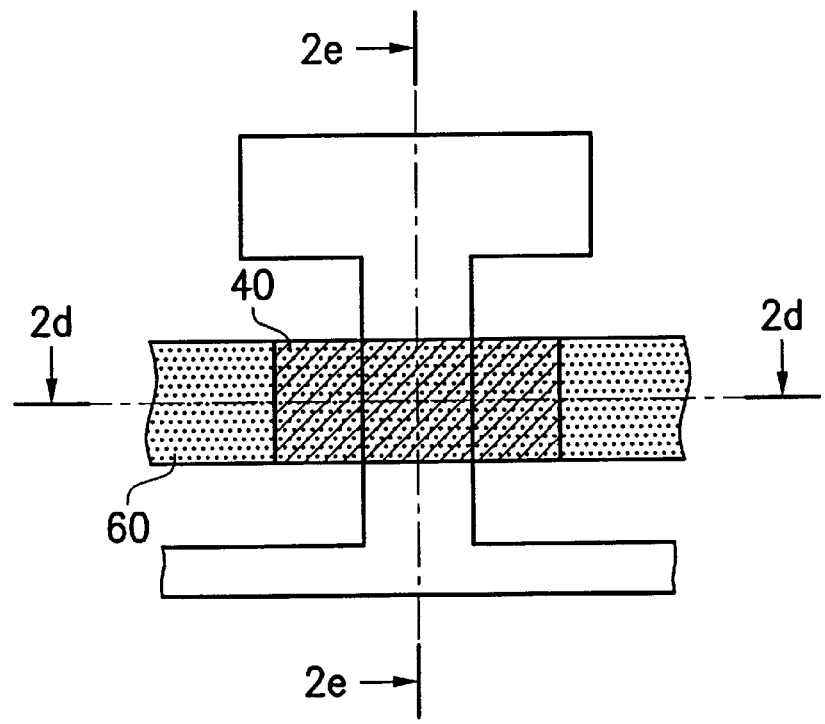
Figure 2A:
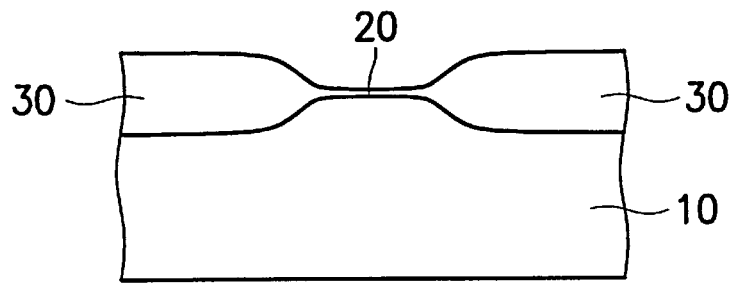
FIG. 2A to FIG. 2E respectively show the corresponding cross-sectional figures of the manufacturing steps of the same conventional on-volatile memory cell.
Figure 2B:
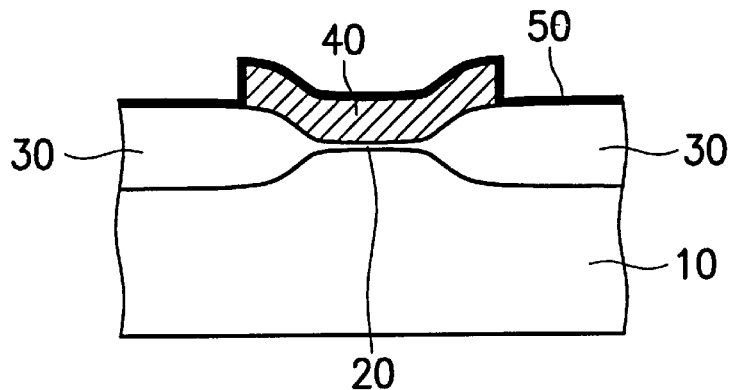
Figure 2C:
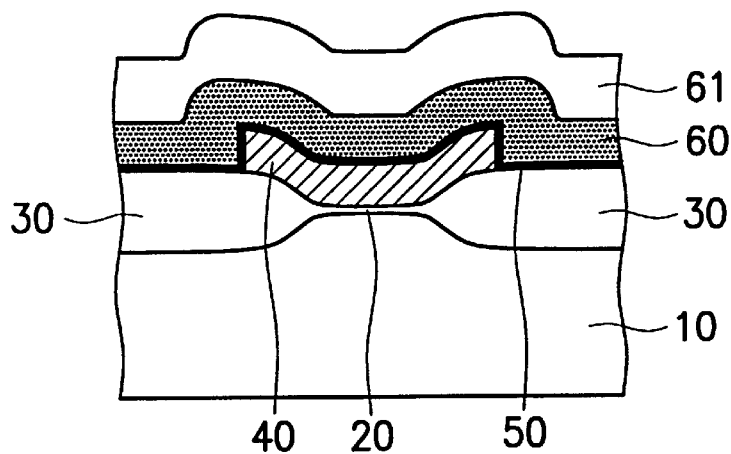
Figure 2D:
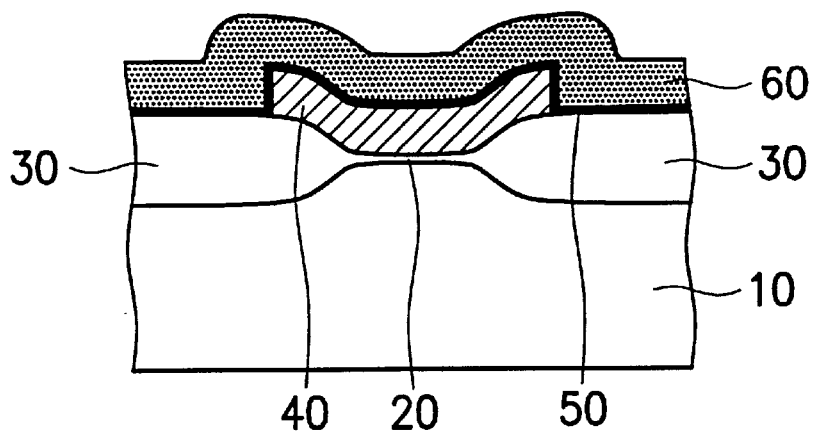
Figure 2E:
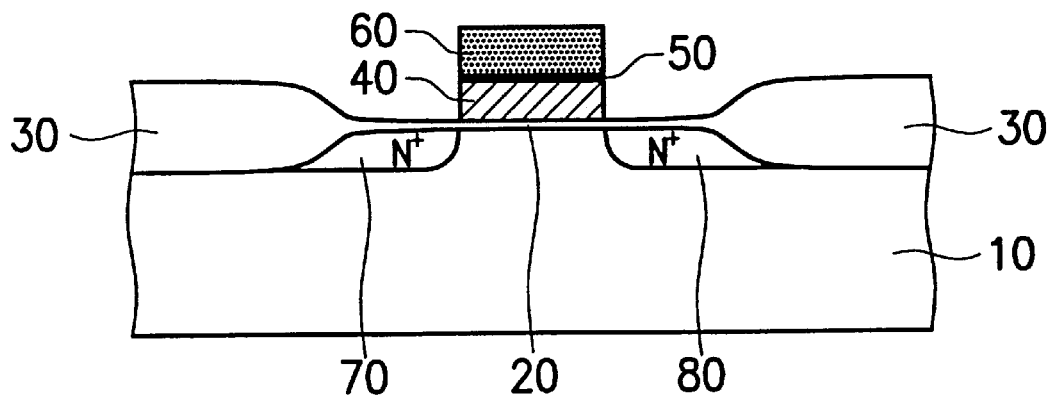
Figure 3:
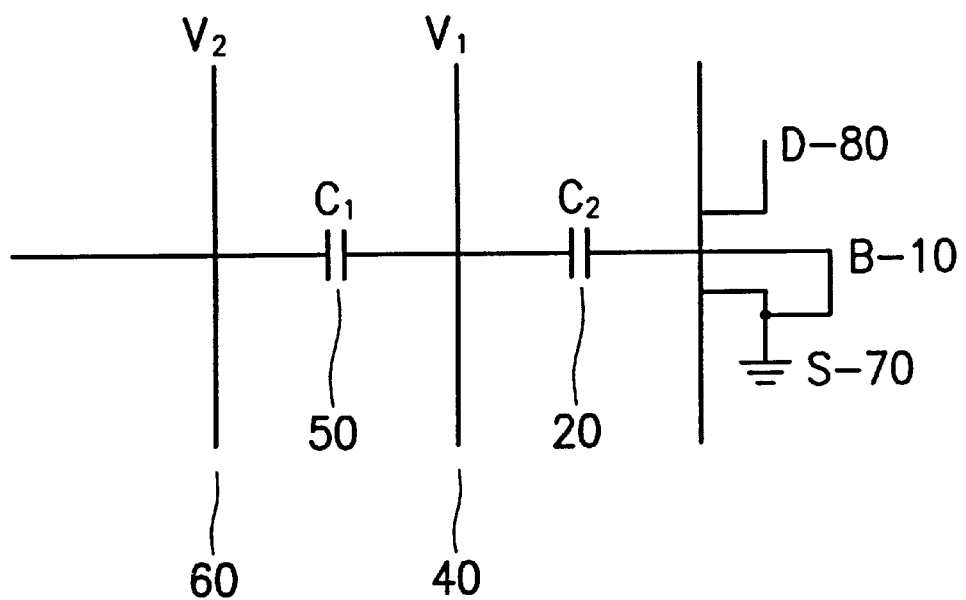
FIG. 3 shows an equivalent circuit diagram of a conventional non-volatile memory cell.
Figure 4:
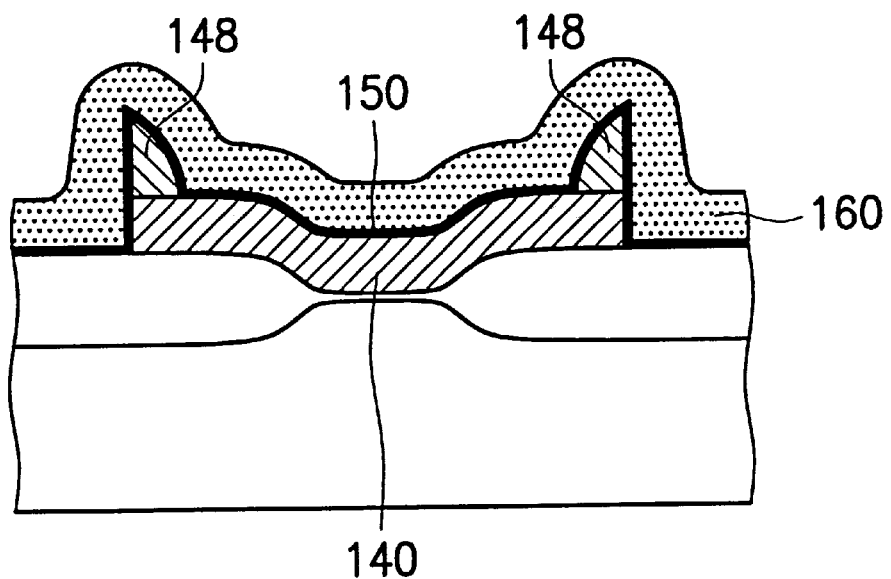
FIG. 4 is a cross-sectional figure of an another conventional non-volatile memory cell.
Figure 5A:
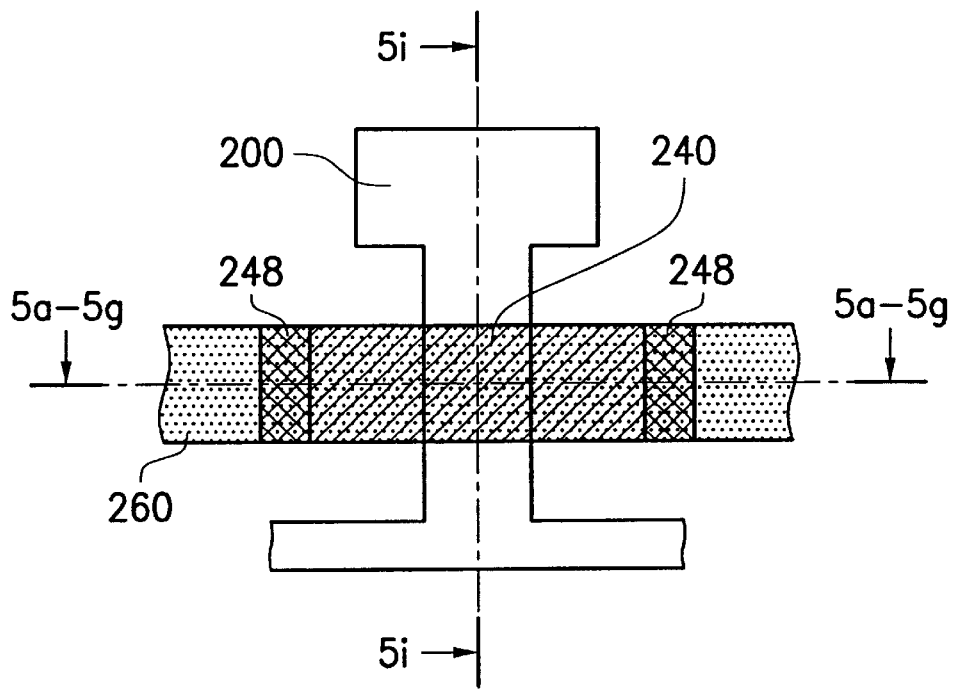
FIG. 5A is a layout figure of the non-volatile memory cell according to one embodiment of this present invention.
Figure 5B:
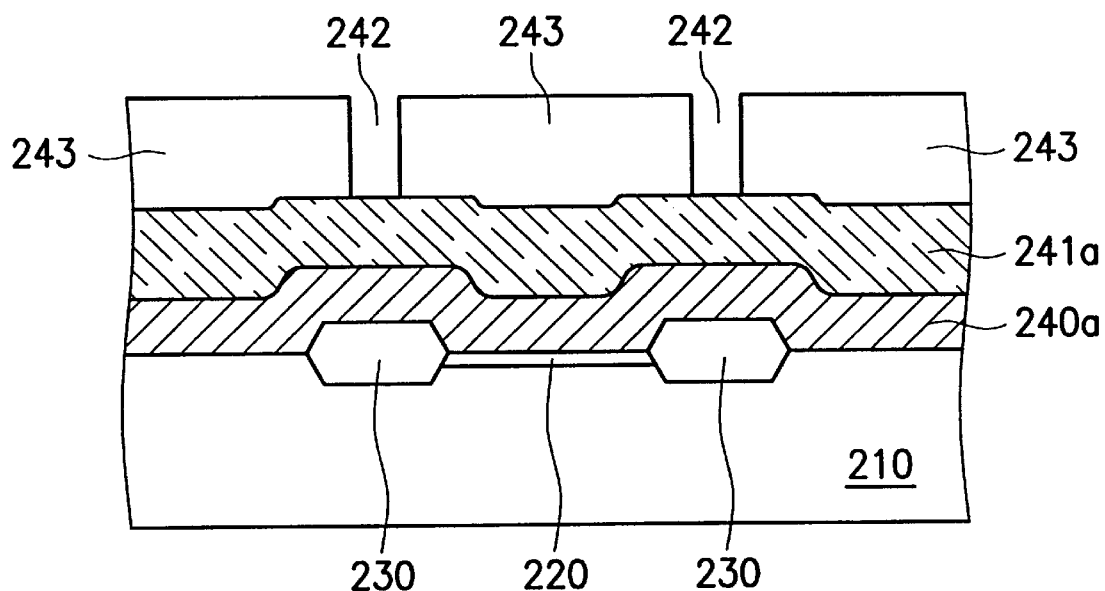
FIG. 5B to FIG. 5I respectively show the corresponding cross-sectional figures of the manufacturing steps of the same non-volatile memory cell shown in FIG. 5A.
Figure 5C:
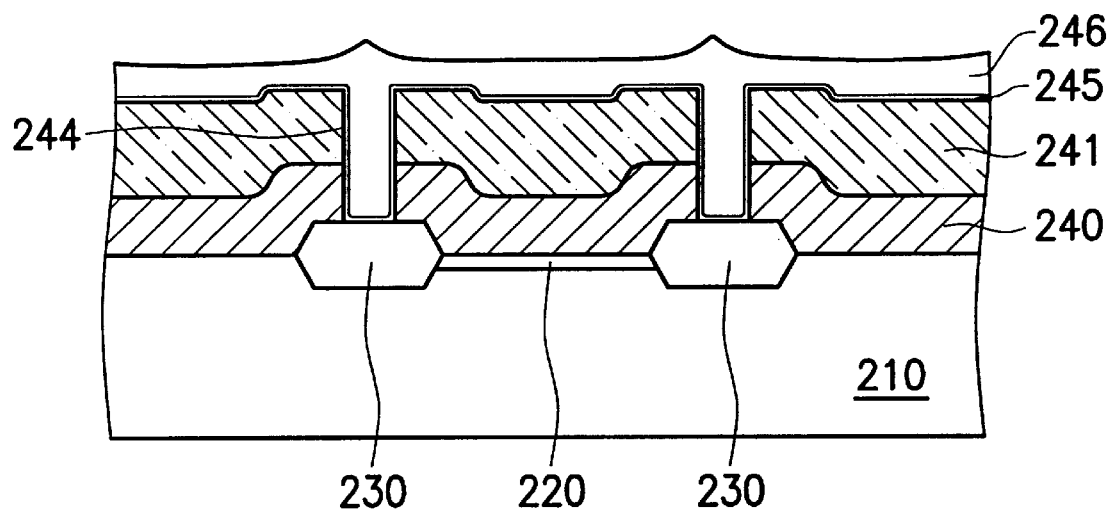
Figure 5D:
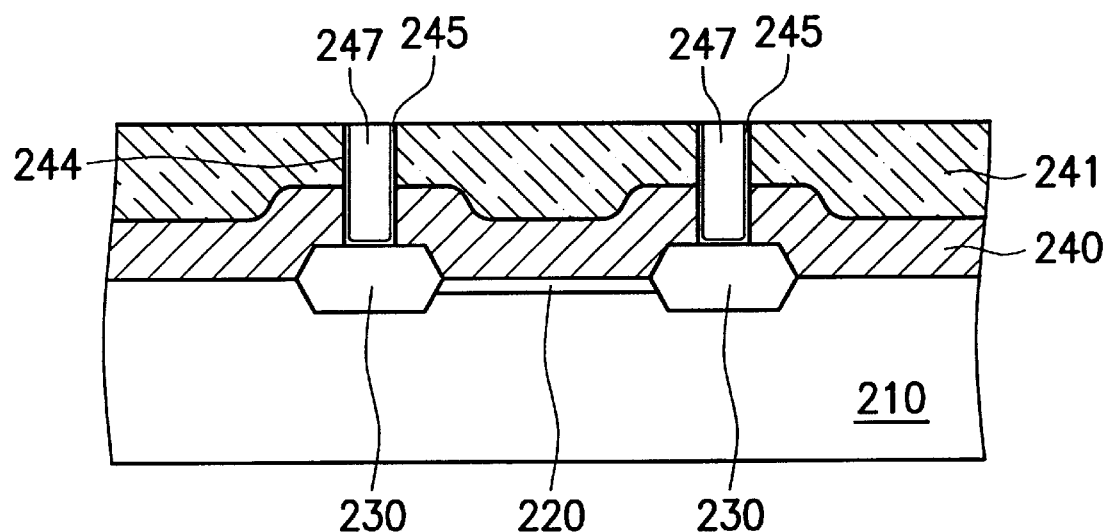
Figure 5E:
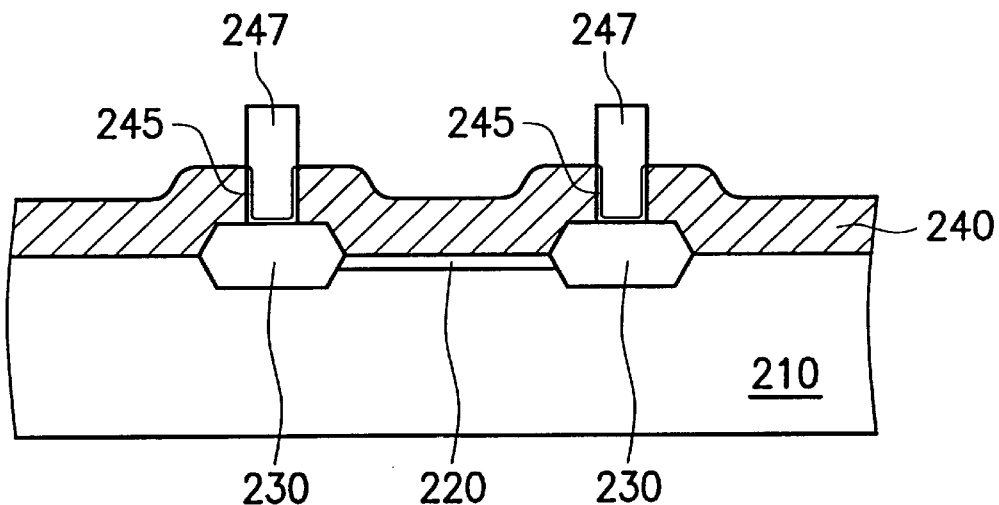
Figure 5F:
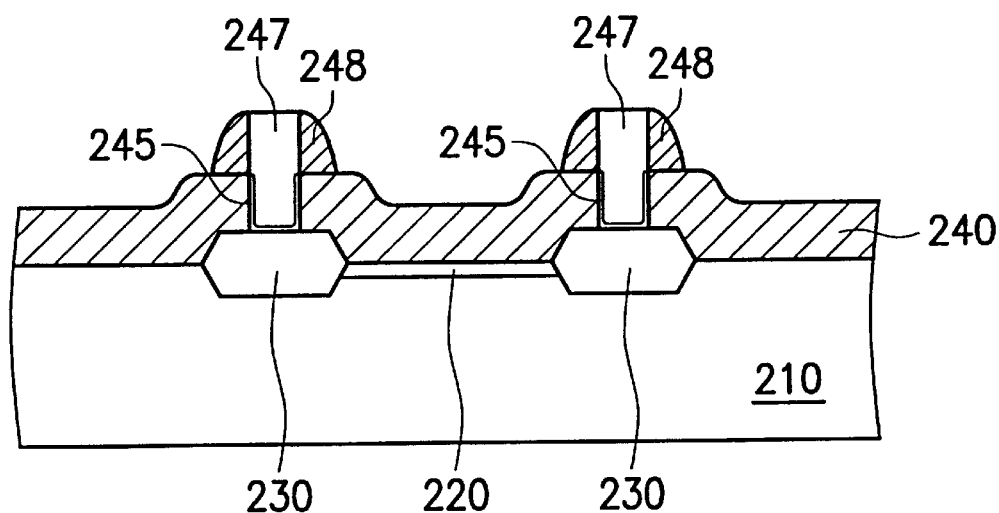
Figure 5G:
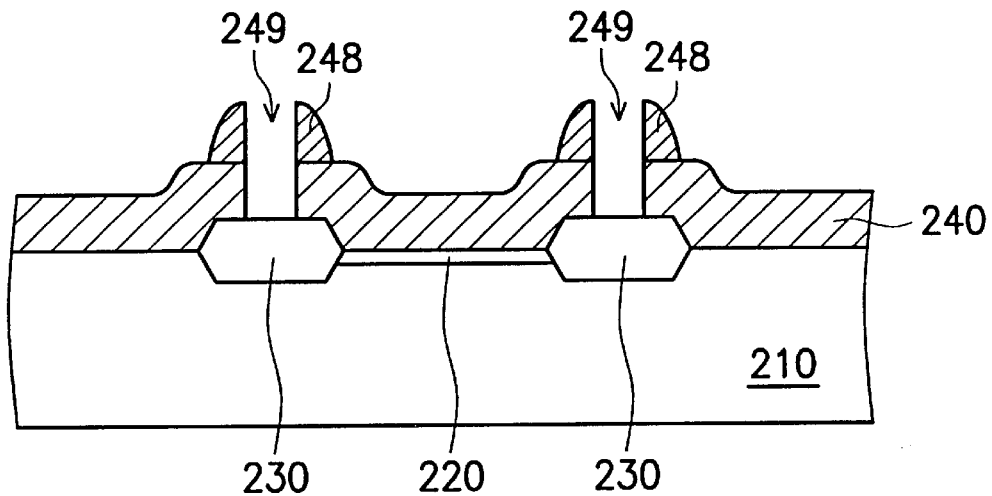
Figure 5H:
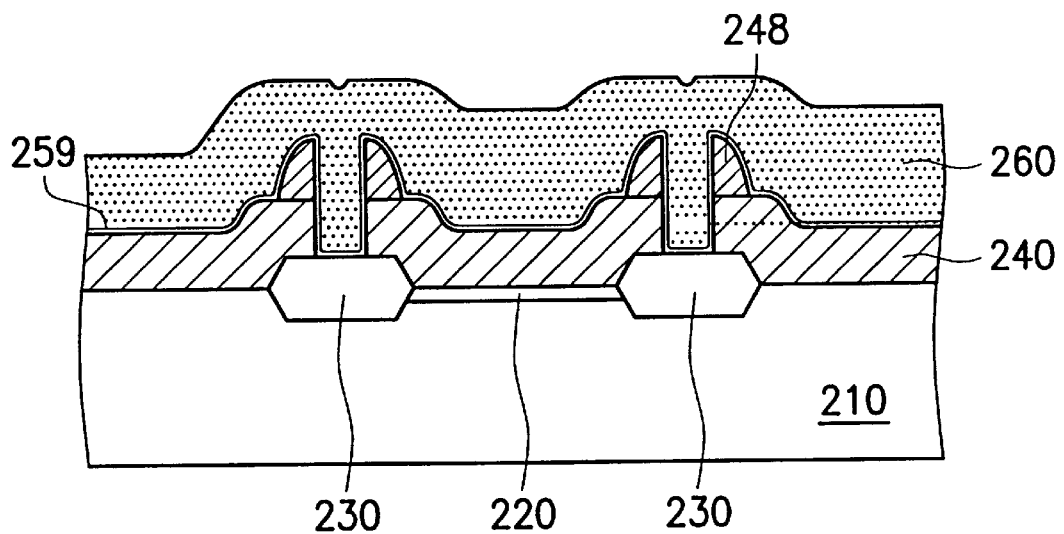
Figure 5I:
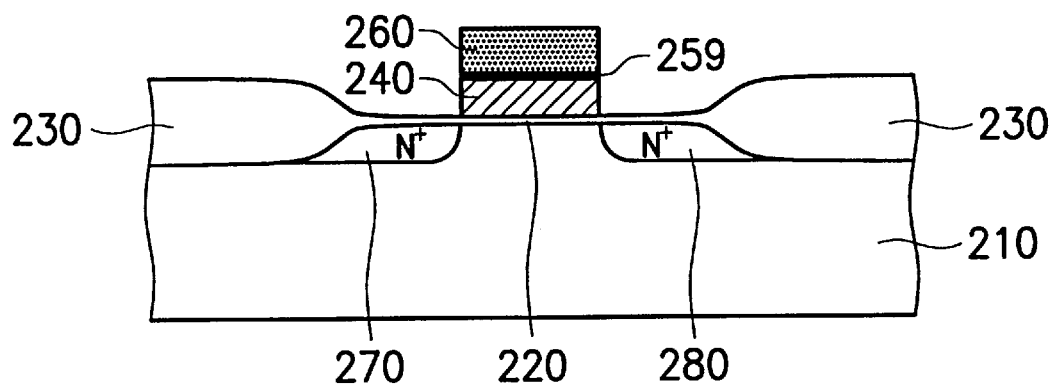

The method for fabricating a non-volatile memory cell according to the present invention is illustrated referring to FIG. 5A to FIG. 5I, wherein FIG. 5A is a layout figure of the non-volatile memory cell of the present invention and the diagrams 5B to 5H and 5I respectively illustrate cross-sectional views of sequential steps in fabricating process of the same non-volatile memory cell. For example, the active region 200 shown in FIG. 5A is defined on the substrate 210 of the memory device shown in FIG. 5B. FIG. 5B to FIG. 5H respectively show the cross-sectional views of the non-volatile memory along the line 5a–5g shown in FIG. 5A. FIG. 5I shows the cross-sectional view of the non-volatile memory cell along the line 5i–5i as shown in FIG. 5A. The following description illustrates FIG. 5A with reference to FIG. 5B to 5I.

Referring to FIG. 5B, the initial step is illustrated, wherein substrate 210 is of a semiconductor material such as a <100> orientation P-type silicon substrate or P-well silicon substrate of germanium or gallium-arsenide materials formed by an epitaxial or a silicon-on-insulator process. For illustration, this preferred embodiment employs a P-well silicon substrate 210 as an example.

The initial step is to define an active region 200 by a commonly utilized isolation structure. For example, a local silicon oxidation method or a shallow trench isolation STI method is utilized to form an isolation field oxide layer 230 for contouring the active region 200.

Then, a channel insulating layer 220 is formed on the surface of the substrate 210 within the active region 200. For example, a thermal oxidation method is utilized to form a channel oxide layer 220 with a thickness of 30~500 Å on the surface of silicon material within the active region.

Subsequently, a conducting layer 240a and an insulating layer 241a are sequentially formed over the semiconductor substrate 210. For example, a chemical vapor deposition process is utilized to deposit a polysilicon layer 240a of thickness 500~5000 Å and a silicon nitride layer 241a of thickness 500~5000 Å. Next, a photoresist material is coated over the insulating layer 241a. Through exposure and photolithography processes, a patterned photoresist 243 and an opening 242 exposing a portion of the surface of the silicon nitride layer 241a are formed.

Then, referring to FIG. 5C, the conducting layer 240a and the insulating layer 241a are defined to form a floating gate 240 on the active region 200 and a cap layer 241 on the floating gate 240. Moreover, an opening 244 is formed to expose a portion of the isolation structure 230. Next, an etching protection layer 245 is conformally formed extending from the isolation structure 230 within the opening 244 up to the cap layer 241. Subsequently, another insulating layer 246 is formed over the substrate 210 and fills up the opening 244.

For example, in this step, the patterned photoresist 243 is utilized as a mask, and a dry etching process is utilized to remove a portion of the polysilicon layer 240a and the silicon nitride layer 241a for forming a floating gate 240, a cap layer 241, and an opening 244 exposing a portion of the field oxide layer 230. Then, a chemical vapor deposition process is utilized to conformally deposit a silicon nitride layer 245 for acting as an etching protection layer. Subsequently, a chemical vapor deposition process is utilized to deposit an oxide layer 246 to fill up the opening 244.

Referring to FIG. 5D, a planarization process is utilized to remove the insulating layer 246 to the surface of the insulating layer 241. The remainder of the insulating layer 247 is left within the opening 244. For example, a chemical mechanical polishing process is utilized to polish the oxide layer 246 to the surface of the cap nitride layer 241. The remainder of the oxide layer 247 is left within the opening 244.

Referring to FIG. 5E, the step to remove the cap layer 241 is shown. For example, a chemical solution with a high etching selection ratio of silicon nitride layer to oxide, e.g., thermal phosphoric acid solution, is utilized to remove the cap nitride layer 241 by wet etching. Thereby, the top of the remainder of the oxide layer 247 can be exposed.

Referring to FIG. 5F, conducting spacers 248 are formed on the sidewalls of the remainder of the insulating layer 247. For example, a chemical vapor deposition process is utilized to deposit a polysilicon layer at first. Then the polysilicon layer is etched back to form polysilicon spacers 248 on the sidewalls of the remainder of the TEOS oxide layer 247.

Referring to FIG. 5G, the remainder of the insulating layer 247 is removed by wet etching. For example, the silicon nitride layer 245 is utilized as an etching protection layer and a chemical solution with a high etching selectivity ratio of oxide layer to silicon nitride layer, e.g., hydrofluoric acid solution, is utilized to remove the TEOS oxide layer 247. Then, the silicon nitride layer 245 is removed by wet etching so as to form the opening 249 exposing a portion of the field oxide layer 230.

Referring to FIG. 5H, an insulating material such as a typical oxide-nitride-oxide ONO structure 259 is conformally deposited on the surface of the polysilicon conducting spacers 248, the polysilicon conducting layer 240 as the floating gate, and the exposed field oxide layer 230. Then, a conventional procedure, such as deposition, photolithography and etching steps, is utilized to form another conducting layer 260, e.g., a polysilicon layer about 1000~5000 Å in thickness, as a controlling gate. Subsequently, the source/drain regions are formed and the fabrication process of a non-volatile memory cell is completed.

In FIG. 5A, the slanted-line shadow area depicts the floating gate 240 and the spotted shadow area depicts the controlling gate 260. As for the cross-line shadow areas at the two sides, they depict the conducting spacers 248.

Further, FIG. 5I shows the cross-sectional view of the memory cell along the line 5i—5i in FIG. 5A. The structure of the non-volatile memory cell in the other direction, including the source region 270 and the drain region 280, can thus be seen.

The materials applied to this present invention should not be limited by those described in the embodiment and can be replaced by materials with appropriate characteristics or formed by appropriate processes. In addition, the size of the structure of the present invention is not limited by that recommended in the embodiment described above.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. A method for fabricating a non-volatile memory cell for a semiconductor substrate comprising the steps of:
   (a) forming an isolation structure to define an active region on the semiconductor substrate;
   (b) forming a first insulating layer on said active region;
   (c) sequentially forming a first conducting layer and a second insulating layer over said semiconductor substrate;
   (d) defining said first conducting layer and said second insulating layer to form a floating gate on said active region, a cap layer on said floating gate, and an opening exposing a portion of said isolation structure;
   (e) forming a third insulating layer over said semiconductor substrate;
   (f) planarizing said third insulating layer to the surface of said cap layer, a remainder of the third insulating layer being thus left within said opening;
   (g) removing said cap layer;
   (h) forming conducting spacers on sidewalls of the remainder of said third insulating layer;
   (i) removing the remainder of said third insulating layer;
   (j) conformally forming a fourth insulating layer on said conducting spacers, said first conducting layer, and said isolation structure;
   (k) forming a second conducting layer as a controlling gate on said fourth insulating layer; and
   (l) forming a source region and a drain region in said active region.

2. The method for fabricating a non-volatile memory cell according to claim 1, comprising a further step, after said step (d), of conformally forming an etching protection layer extending from said isolation structure within said opening to said cap layer.

3. The method for fabricating a non-volatile memory cell according to claim 2, comprising a further step, after said step (i), of removing said etching protection layer.

4. The method for fabricating a non-volatile memory cell according to claim 3, wherein said etching protection layer is a silicon nitride layer.

5. The method for fabricating a non-volatile memory cell according to claim 1, wherein said first insulating layer is an oxide layer 30~150 Å in thickness.

6. The method for fabricating a non-volatile memory cell according to claim 1, wherein said first conducting layer is a polysilicon layer 500~5000 Å in thickness.

7. The method for fabricating a non-volatile memory cell according to claim 1, wherein said second insulating layer is a silicon nitride layer 500~5000 Å in thickness.

8. The method for fabricating a non-volatile memory cell according to claim 1, wherein said third insulating layer is an oxide layer 1000~10000 Å in thickness.

9. The method for fabricating a non-volatile memory cell according to claim 1, wherein said conducting spacers are polysilicon spacers.

10. The method for fabricating a non-volatile memory cell according to claim 1, wherein said fourth insulating layer is an oxide-nitride-oxide ONO structure.

11. The method for fabricating a non-volatile memory cell according to claim 1, wherein said second conducting layer is a polysilicon layer 1000~5000 Å in thickness.

12. A method for fabricating a non-volatile memory cell for a semiconductor substrate comprising the steps of:
   (a) forming an isolation structure to define an active region on the semiconductor substrate;
   (b) forming a first oxide layer on said active region;
   (c) sequentially forming a first conducting layer and a silicon nitride layer over said semiconductor substrate;
   (d) defining said first conducting layer and said silicon nitride layer to form a floating gate on said active region, a cap nitride layer on said floating gate, and an opening exposing a portion of said isolation structure;
   (e) conformally forming an etching protection layer which extends from said isolation structure within said opening up to said cap nitride layer;
   (f) forming a second oxide layer over the semiconductor;
   (g) planarizing said second oxide layer to the surface of said etching protection layer, a remainder of the second oxide layer being thus left within said opening;
   (h) removing said cap nitride layer;
   (i) forming conducting spacers on sidewalls of the remainder of said second oxide layer;
   (j) removing the remainder of said second oxide layer;
   (k) conformally forming an oxide-nitride-oxide structure on said conducting spacers, said first conducting layer, and the portion of said isolation structure;
   (l) forming a second conducting layer as a controlling gate on said oxide-nitride-oxide structure; and
   (m) forming a source region and a drain region in said active region.

13. The method for fabricating a non-volatile memory cell according to claim 12, further comprising a step, after said step (i), of removing said etching protection layer.

14. The method for fabricating a non-volatile memory cell according to claim 13, wherein said etching protection layer is a silicon nitride layer.

* * * * *